US 6,599,815 B1

(12) United States Patent
Yang

(10) Patent No.: US 6,599,815 B1
(45) Date of Patent: Jul. 29, 2003

(54) METHOD AND APPARATUS FOR FORMING A SILICON WAFER WITH A DENUDED ZONE

(75) Inventor: Charles Chiun-Chieh Yang, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 257 days.

(21) Appl. No.: 09/607,391

(22) Filed: Jun. 30, 2000

(51) Int. Cl.$^7$ .............................................. H01L 21/322
(52) U.S. Cl. ...................................... 438/471; 438/795
(58) Field of Search .................... 438/58, 143, 310, 438/471–477, 795–799

(56) References Cited

U.S. PATENT DOCUMENTS

| 4,314,595 A | 2/1982 | Yamamoto et al. .......... 148/1.5 |
| 4,376,657 A | 3/1983 | Nagasawa et al. ........... 148/1.5 |
| 4,437,922 A | 3/1984 | Bischoff et al. ............. 156/603 |
| 4,468,259 A | * 8/1984 | Mimura ........................ 427/55 |
| 4,505,759 A | 3/1985 | O'Mara ....................... 148/1.5 |
| 4,548,654 A | 10/1985 | Tobin ......................... 148/1.5 |
| 4,679,359 A | 7/1987 | Suzuki |
| 4,788,994 A | 12/1988 | Shinbara |
| 4,851,358 A | 7/1989 | Huber .......................... 437/10 |
| 4,868,133 A | 9/1989 | Huber .......................... 437/10 |
| 4,958,061 A | 9/1990 | Wakabayashi et al. ...... 219/411 |
| 5,011,794 A | * 4/1991 | Grim et al. |
| 5,100,502 A | 3/1992 | Murdoch et al. ........... 156/643 |
| 5,271,796 A | 12/1993 | Miyashita et al. .......... 156/626 |
| 5,327,007 A | 7/1994 | Imura et al. ................. 257/610 |

(List continued on next page.)

FOREIGN PATENT DOCUMENTS

| DE | 43 23 964 A1 | 1/1994 | ......... H01L/21/324 |
| EP | 0 536 958 A1 | 4/1993 | .......... C30B/15/00 |
| EP | 0 716 168 A1 | 6/1996 | .......... C30B/15/14 |
| EP | 0 503 816 B1 | 9/1996 | .......... C30B/33/02 |
| JP | 402243594 A | 9/1990 | .......... C30B/25/02 |
| JP | 3-9078 | 2/1991 | .......... C30B/29/06 |
| JP | 5-155700 | 6/1993 | .......... C30B/33/02 |
| JP | 7-201874 | 5/1995 | ......... H01L/21/322 |
| JP | 7321120 | 12/1995 | ......... H01L/21/322 |
| JP | 7335657 | 12/1995 | ......... H01L/21/322 |
| JP | 8045944 | 2/1996 | ......... H01L/21/322 |
| JP | 8045945 | 2/1996 | ......... H01L/21/322 |
| JP | 8045947 | 2/1996 | ......... H01L/21/322 |
| JP | 9-199416 | 7/1997 | .......... H01L/21/20 |
| JP | 11-067781 | 3/1999 | ......... H01L/21/322 |

(List continued on next page.)

OTHER PUBLICATIONS

Abe, T., "Innovated Silicon Crystal Growth and Wafering Technologies", Electrochemical Soc. Pro., vol. 97, No. 3, pp. 123–133, 1997.

Abe, T., "Defect–Free Surfaces of Bulk Wafers By Combination of RTA and Crystal Growth Conditions", (reference information unknown).

Chiou, H., "The Effects of Preheatings on Axial Oxygen Precipitation Uniformity in Czochralski Silicon Crystals", J. Electrochem. Soc., vol. 139, No. 6, pp. 1680–1684, Jun., 1992

(List continued on next page.)

Primary Examiner—Savitri Mulpuri
(74) Attorney, Agent, or Firm—Senniger, Powers, Leavitt & Roedel

(57) ABSTRACT

An apparatus and method for forming an epitaxial layer on and a denuded zone in a semiconductor wafer. A single chamber is used to form both the epitaxial layer and the denuded zone. The denuded zone is formed by heating the wafer in the chamber and then rapidly cooling the wafer while it is supported on an annular support whereby only a peripheral edge portion of the wafer is in contact with the support.

17 Claims, 5 Drawing Sheets

U.S. PATENT DOCUMENTS

| | | | |
|---|---|---|---|
| 5,332,443 A | 7/1994 | Chew et al. | 118/729 |
| 5,401,669 A | 3/1995 | Falster et al. | 437/12 |
| 5,403,406 A | 4/1995 | Falster et al. | 148/33.2 |
| 5,445,491 A | 8/1995 | Nakagawa et al. | 414/786 |
| 5,445,975 A | 8/1995 | Gardner et al. | 437/10 |
| 5,487,358 A | 1/1996 | Ohta et al. | 117/200 |
| 5,502,010 A | 3/1996 | Nadahara et al. | 437/247 |
| 5,502,331 A | 3/1996 | Inoue et al. | 257/617 |
| 5,534,294 A | 7/1996 | Kubota et al. | 427/255 |
| 5,551,982 A | 9/1996 | Anderson et al. | 118/715 |
| 5,561,316 A | 10/1996 | Fellner | 257/549 |
| 5,587,019 A | 12/1996 | Fujie | 118/725 |
| 5,589,224 A | 12/1996 | Tepman et al. | 427/248.1 |
| 5,593,494 A | 1/1997 | Falster | 117/2 |
| 5,611,855 A | 3/1997 | Wijaranakula | 117/2 |
| 5,674,756 A | 10/1997 | Satoh et al. | 437/10 |
| 5,738,751 A | 4/1998 | Camerson | 156/345 |
| 5,738,942 A | 4/1998 | Kubota et al. | 428/428 |
| 5,772,773 A | 6/1998 | Wytman | 118/729 |
| 5,788,763 A | 8/1998 | Hayashi et al. | 117/2 |
| 5,789,309 A | 8/1998 | Hellwig | 438/478 |
| 5,820,685 A | 10/1998 | Kurihara et al. | 118/729 |
| 5,848,670 A | 12/1998 | Salzman | 187/272 |
| 5,856,240 A | 1/1999 | Sinha et al. | 438/758 |
| 5,860,848 A | 1/1999 | Loncki et al. | 451/36 |
| 5,939,770 A | 8/1999 | Kageyama | 257/611 |
| 5,944,889 A | 8/1999 | Park et al. | 117/94 |
| 5,966,765 A | 10/1999 | Hamada et al. | |
| 6,143,071 A * | 11/2000 | Aihara et al. | 438/795 |
| 6,167,893 B1 | 1/2001 | Taatjes et al. | |
| 6,227,944 B1 | 5/2001 | Xin et al. | |
| 6,284,384 B1 | 9/2001 | Wilson et al. | |
| 6,444,027 B1 * | 9/2002 | Yang et al. | 117/200 |
| 2001/0037761 A1 * | 11/2001 | Reis et al. | 117/200 |

FOREIGN PATENT DOCUMENTS

| | | | |
|---|---|---|---|
| JP | 11-150119 | 6/1999 | H01L/21/322 |
| WO | WO 98/38675 | 9/1998 | H01L/21/322 |
| WO | WO 98/45507 | 10/1998 | C30B/15/00 |
| WO | WO 00/08677 | 2/2000 | H01L/21/22 |
| WO | WO 00/13211 | 3/2000 | H01L/21/00 |
| WO | WO 00/34999 | 6/2000 | H01L/21/322 |

OTHER PUBLICATIONS

Falster, R., et al., "The Engineering of Silicon Wafer Material Properties Through Vacancy Concentration Profile Control and the Achievement of Ideal Oxygen Precipitation Behavior", Mat. Res. Soc. Symp. Proc., vol. 510, pp. 27–35, 1998.

Hara, A., et al., "Enhancement of Oxygen Precipitation in Quenched Czochralski Silicon Crystals", J. Appl. Phys., vol. 66, pp. 3958–3960, 1989.

Hawkins, G. A, et al., "Effect of Rapid Thermal Processing on Oxygen Precipitation in Silicon", Mat. Res. Soc. Symp. Proc., vol. 104, pp. 197–200, 1988.

Hawkins, G. A., et al., "The Effect of Rapid Thermal Annealing on the Precipitation of Oxygen in Silicon", J. Appl. Phys., vol. 65, No. 9, pp. 3644–3654, 1989.

Jacob, M., et al., "Influence of RTP on Vacancy Concentrations", Mat. Res. Soc. Symp. Proc., vol. 490, pp. 129–134, 1998.

Nadahara, S., et al., "Hydrogen Annealed Silicon Wafer", Solid State Phenomena, vols. 57–58, pp. 19–26, 1997.

Pagani, M., et al., "Spatial Variations in Oxygen Precipitation in Silicon After High Temperature Rapid Thermal Annealing", Appl. Phys. Lett., vol. 70, No. 12, pp. 1572–1574, 1998.

Schmolke R., et al., "Defect Depth Profile in Si(100) p/p Epitaxial Wafers", The Electrochem Soc. Proc., vol. 98, No. 1, pp. 855–866, 1998.

Shimizu, H., et al., "Effects of Surface Defects (COPs) On Isolation Leakage And Gate Oxide Integrity in Mos Large–Scale–Integrated–Circuit Devices And Cost Effective p–/p– Epitaxial Wafers", Electrochemical Society Proceedings, vol. 99–1, pp. 315–323 (from a presentation on or about May 3, 1999).

Shimizu, H., et al., "Excellence of Gate Oxide Integrity in Metal–Oxide–Semiconductor Large–Scale–Integrated Circuits Based on P–/P–Thin–Film Expitaxial Silicon Wafers", Jpn. J. Appl. Phys., vol. 36, p. 2565–2570, 1997.

Shimura, F., "Semiconductor Silicon Crystal Technology", Academic Press, Inc., San Diego, CA, pp. 361–367, 1989.

Zimmerman, H., et al., "Vacancy Concentration Wafer Mapping in Silicon", J. Crystal Growth, vol. 129, pp. 582–592, 1993.

International Search Report for Application No. PCT/US 01/15502, filed May 14, 2001, 4 pages.

* cited by examiner

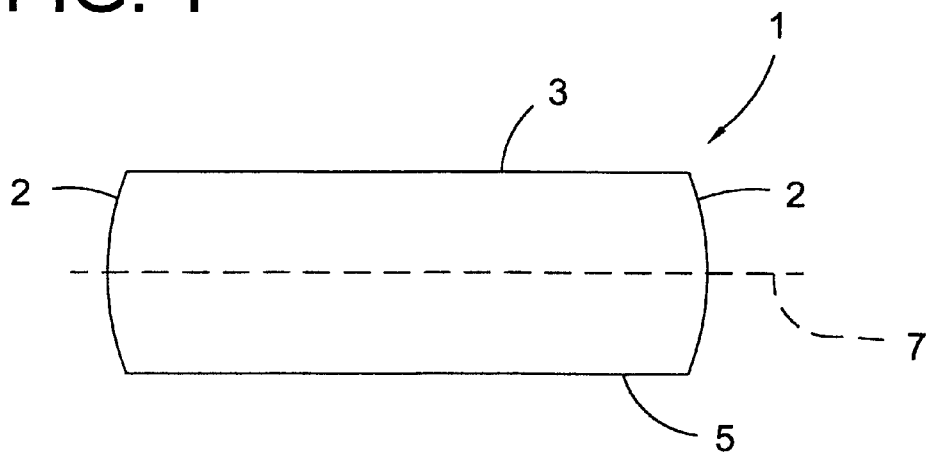
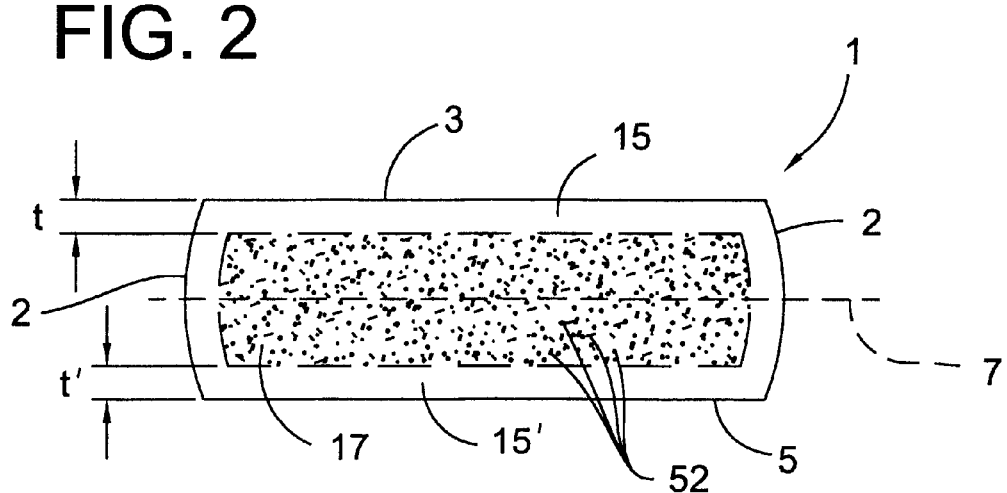
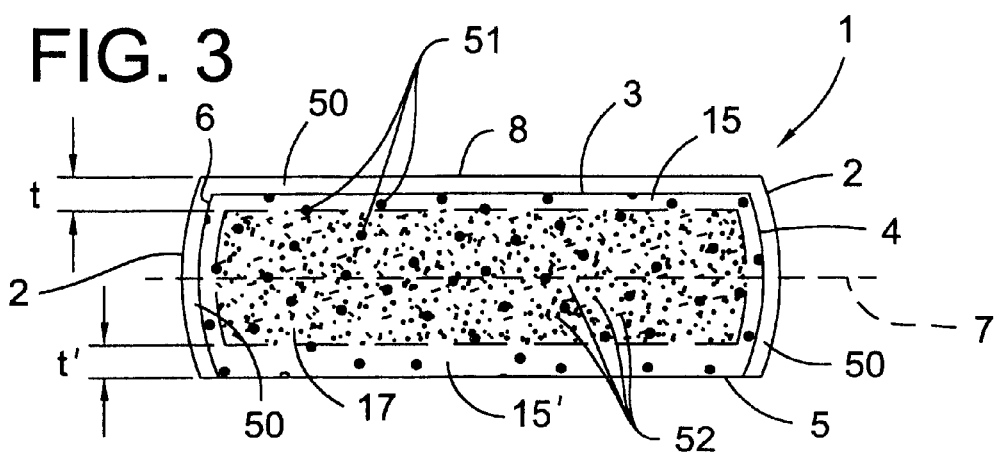

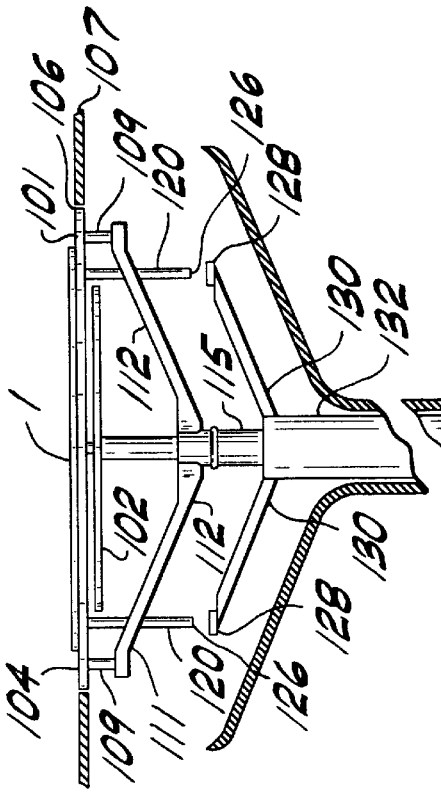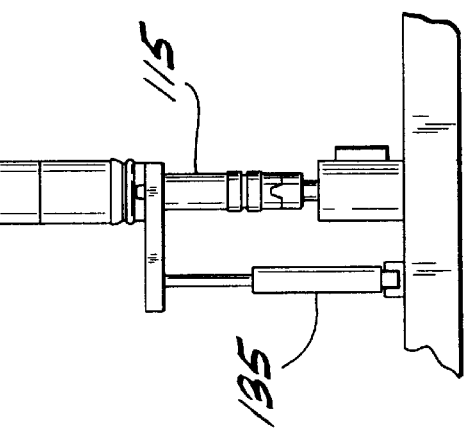
FIG. 4
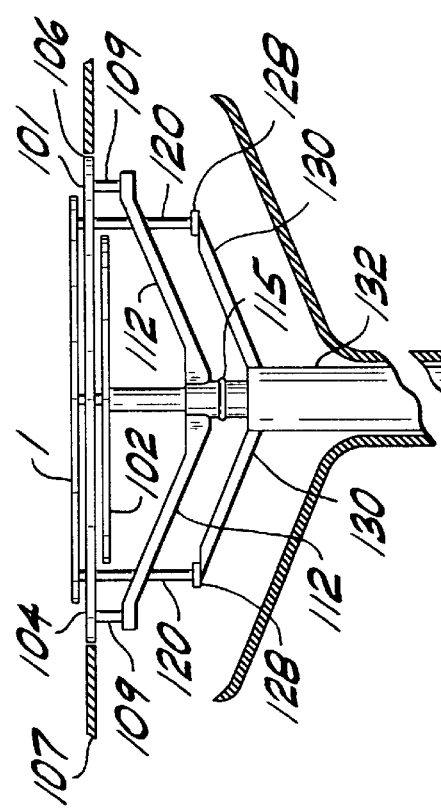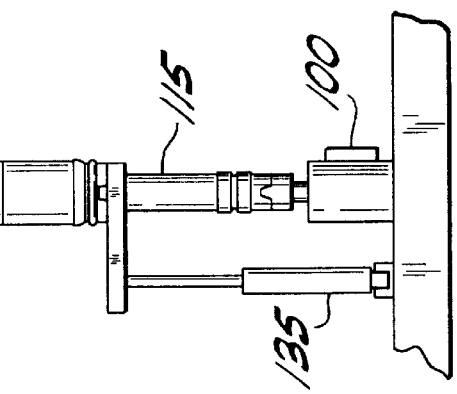
FIG. 5

METHOD AND APPARATUS FOR FORMING A SILICON WAFER WITH A DENUDED ZONE

BACKGROUND OF THE INVENTION

The present invention generally relates to a method and apparatus for the preparation of semiconductor material substrates, especially silicon wafers, which are used in the manufacture of electronic components. More particularly, the present invention relates to a single crystal silicon wafer and a method for the preparation thereof. The wafer includes a denuded zone of an ideal, non-uniform depth distribution of oxygen precipitates formed during the heat treatment cycles of essentially any electronic device manufacturing process. Additionally, the wafer comprises at least one major surface having an epitaxial silicon layer deposited thereon, and.

Single crystal silicon, which is the starting material for most processes used to fabricate semiconductor electronic components, is commonly prepared by using the Czochralski ("Cz") process. In this method, polycrystalline silicon ("polysilicon") is charged to a crucible and melted, a seed crystal is brought into contact with the molten silicon, and a single crystal is grown by slow extraction. The first portion of the crystal to be formed during the extraction process is a thin neck. After formation of the neck is complete, the diameter of the crystal is enlarged by decreasing the pulling rate and/or the melt temperature until the desired or target diameter is reached. A cylindrical main body of the crystal which has an approximately constant diameter is then grown by controlling the pull rate and the melt temperature while compensating for the decreasing melt level. Near the end of the growth process, but before the crucible is emptied of molten silicon, the crystal diameter is reduced gradually to form an end-cone. Typically, the end-cone is formed by increasing the crystal pull rate and heat supplied to the crucible. When the diameter becomes small enough, the crystal is then separated from the melt.

A number of defects in single crystal silicon form in the crystal growth chamber as the crystal cools after solidification. Such defects arise, in part, due to the presence of an excess (i.e., a concentration above the solubility limit) of intrinsic point defects, which are known as crystal lattice vacancies and silicon self-interstitials. Silicon crystals grown from a melt are typically grown with an excess of one or the other type of intrinsic point defect. It has been suggested that the type and initial concentration of these point defects in the silicon are determined at the time of solidification and, if these concentrations reach a level of critical supersaturation in the system and the mobility of the point defects is sufficiently high, a reaction (or an agglomeration event) will likely occur. The density of agglomerated intrinsic point defects in Cz silicon is conventionally within the range of about $1 \times 10^3/cm^3$ to about $1 \times 10^7/cm^3$. While these values are relatively low, agglomerated intrinsic point defects are of rapidly increasing importance to device manufacturers and, in fact, are now seen as yield-limiting factors in device fabrication processes and can severely impact the yield potential of the material in the production of complex and highly integrated circuits.

One particularly problematic type of defect is the presence of crystal originated pits ("COPs"). The source of this type of defect is the agglomeration of silicon lattice vacancies. More specifically, when silicon lattice vacancies agglomerate within a silicon ingot, they form voids. Subsequently, when the ingot is sliced into wafers, these voids are exposed and appear as pits on the wafer surfaces. These pits are referred to as COPs.

To date, there generally are three main approaches to dealing with the problem of agglomerated intrinsic point defects. The first approach includes methods which focus on crystal pulling techniques in order to reduce the number density of agglomerated intrinsic point defects in the ingot. This approach can be further subdivided into those methods having crystal pulling conditions which result in the formation of vacancy dominated material, and those methods having crystal pulling conditions which result in the formation of self-interstitial dominated material. For example, it has been suggested that the number density of agglomerated defects can be reduced by (i) controlling $v/G_0$ (where v is the growth velocity and $G_0$ is the average axial temperature gradient) to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation. As the requirements imposed by device manufacturers become more and more stringent, the presence of these defects will continue to become more of a problem.

Others have suggested reducing the pull rate during the growth of the body of the crystal to a value less than about 0.4 mm/minute. This suggestion, however, is also not satisfactory because such a slow pull rate leads to reduced throughput for each crystal puller. More importantly, such pull rates lead to the formation of single crystal silicon having a high concentration of self-interstitials. This high concentration, in turn, leads to the formation of agglomerated self-interstitial defects and all the resulting problems associated with such defects.

A second approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, in European Patent Application No. 503,816 Al Fusegawa et al. Propose growing the silicon ingot at a growth rate in excess of 0.8 mm/minute, and heat treating the wafers which are sliced from the ingot at a temperature in the range of 1150° C. to 1280° C. to reduce the defect density in a thin region near the wafer surface. The specific treatment needed will vary depending upon the concentration and location of agglomerated intrinsic point defects in the wafer. Different wafers cut from a crystal which does not have a uniform axial concentration of such defects may require different post-growth processing conditions. Further, such wafer heat treatments are relatively costly, have the potential for introducing metallic impurities into the silicon wafers, and are not universally effective for all types of crystal-related defects.

A third approach to dealing with the problem of agglomerated intrinsic point defects is the epitaxial deposition of a thin crystalline layer of silicon onto the surface of a single crystal silicon wafer. This process provides a single crystal silicon wafer having a surface which is substantially free of agglomerated intrinsic point defects. Use of the traditional epitaxial deposition techniques, however, substantially increases the cost of the wafer.

In addition to containing the above-discussed agglomerated point defects, single crystal silicon prepared by the Cz method also typically contains various impurities, among which is mainly oxygen. This contamination, for example, occurs while the molten silicon is contained in the quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. Thus, as the crystal grows from the molten mass and cools, the solubility of oxygen in it decreases rapidly. This ultimately results in wafers containing oxygen in supersaturated concentrations.

Thermal treatment cycles which are typically employed in the fabrication of electronic devices can cause the precipitation of oxygen in silicon wafers which are supersaturated in oxygen. Depending on their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic getting ("IG").

Historically, electronic device fabrication processes have included a series of steps which were designed to produce silicon having a region near the surface of the wafer which is free of oxygen precipitates (commonly referred to as a "denuded zone" or a "precipitate free zone") with the balance of the wafer (i.e., the wafer bulk) containing a sufficient number of oxygen precipitates for IG purposes. Denuded zones have been formed, for example, in a high-low-high thermal sequence such as (a) oxygen out-diffusion heat treatment at a high temperature (>1100° C.) in an inert gas for a period of at least about 4 hours, (b) oxygen precipitate nuclei formation at a low temperature (600 to 750° C.), and (c) growth of oxygen ($SiO_2$) precipitates at a high temperature (1000 to 1150° C.). See, e.g., *F. Shimura, Semiconductor Silicon Crystal Technology*, pp. 361–367 (Academic Press, Inc., San Diego Calif., 1989) (and the references cited therein).

More recently, however, advanced electronic device manufacturing processes, such as DRAM manufacturing processes, have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, all IG potential is lost.

SUMMARY OF THE INVENTION

Among the objects of the present invention is the provision of a single crystal silicon wafer which (a) forms an ideal, non-uniform depth distribution of oxygen precipitates during a heat treatment cycle of essentially any electronic device manufacturing process; and may also (b) have an epitaxial surface that is free of crystal originated pits; the provision of an apparatus that is effective in increasing the cooling rate of a heated semiconductor wafer; and the provision of an apparatus that is useful to form both a denuded zone in and an epitaxial layer on a semiconductor wafer.

One aspect of the present invention involves the provision of a method of processing semiconductor wafers to produce a denuded zone by heating and cooling the wafer in a chamber having a heat source and an annular wafer support. The method includes placing a semiconductor wafer in a chamber having an interior, a heat source operatively associated with the interior and an annular wafer support positioned in the interior. The wafer is heated in the chamber interior to a temperature of at least about 1175° C. and is thereafter cooled at a rate of at least about 10° C./sec. until the wafer has a temperature of less than about 850° C. During cooling, the wafer rests on the annular support whereby only a peripheral portion of the wafer is in contact with said support.

Another aspect of the present invention involves an apparatus for processing a semiconductor wafer to form a denuded zone. The apparatus includes a chamber having an interior defined by walls and a selectively openable door wherein the chamber interior can be sealed from the exterior thereof during operation. A heat source is operably associated with the chamber for selectively heating contents in the chamber interior. A wafer support comprises an annular ring for receiving a wafer thereon to be in supporting relation to the wafer during at least a portion of the time the wafer is in the chamber interior. A first support means is in engagement with the annular ring for supporting the annular ring in spaced relation to the walls.

Other objects and features will be in part apparent and in part pointed out hereinafter.

BRIEF DESCRIPTION OF THE DRAWINGS

FIG. 1 shows the preferred structure of a single crystal silicon wafer that may be used as the starting material in accordance with the instant invention.

FIG. 2 shows an oxygen precipitate profile of a wafer which may be prepared in accordance with the preferred embodiment of the instant invention.

FIG. 3 shows an oxygen precipitate profile of a wafer which may be prepared in accordance with a preferred embodiment of the instant invention where the starting material is a vacancy-rich single crystal silicon wafer.

FIG. 4 is a schematic diagram of the mechanism used in a reactor for positioning a wafer within the reactor. In this figure, the susceptor support shaft 105 and wafer lift shaft 107 are in the wafer elevated position.

FIG. 5 is a schematic diagram of the mechanism used in a reactor for positioning a wafer within the reactor, wherein the susceptor support shaft 105 and wafer lift shaft 107 are in the wafer heating position.

DETAILED DESCRIPTION OF THE PREFERRED EMBODIMENT

Figure 6:
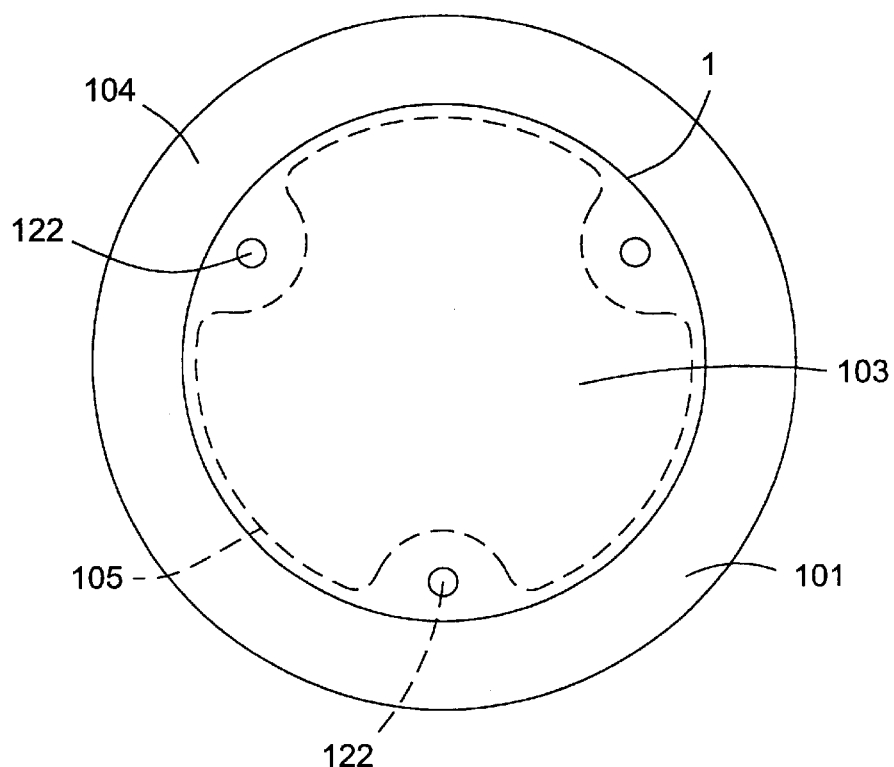
FIG. 6 is a schematic diagram of the wafer support in plan view used in a reactor for positioning a wafer within the reactor.

In accordance with the present invention, a novel and useful single crystal silicon wafer which may include at least one surface having an epitaxial silicon layer deposited thereon and at least one denuded zone that are formed in one chamber has been developed. The epitaxial surface of the wafer is free of crystal originated pits, and the wafer contains a "template" that determines the manner in which oxygen will precipitate when the wafer is heated during the electronic device manufacturing process. Thus, during a heating step of essentially any electronic device manufacturing process, the wafer will form (a) a denuded zone of sufficient depth, and (b) a wafer bulk containing a sufficient density of oxygen precipitates for IG purposes. Also in accordance with this invention, a novel method has been developed for preparing such a single crystal silicon wafer. This method may be completed in a matter of minutes using equipment which is in common use in the semiconductor silicon manufacturing industry and eliminating the need for one expensive piece of manufacturing equipment, an RTA.

A. Starting Material

The starting material for the ideal precipitating wafer of the present invention is a single crystal silicon wafer which has been sliced from a single crystal ingot grown in accordance with any of the conventional variations of the Cz crystal growing method. This method, as well as standard silicon slicing, lapping, etching, and polishing techniques, are well known in the art and disclosed, for example, in *F. Shimura, Semiconductor Silicon Crystal Technology* (Academic Press, 1989); and *Silicon Chemical Etching*, (J. Grabmaier, ed., Springer-Verlag, N.Y., 1982).

Referring to FIG. 1, the wafer 1 preferably has a front surface 3, a back surface 5, and an imaginary central plane 7 between the front and back surfaces. The terms "front" and "back" in this context are used to distinguish the two major, generally planar surfaces of the wafer 1. The front surface 3 of the wafer 1 (as that phrase is used herein) is not necessarily the surface onto which an electronic device will subsequently be fabricated, nor is the back surface 5 of the wafer 1 (as that phrase is used herein) necessarily the major surface of the wafer 1 which is opposite the surface onto which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

The wafer may contain one or more dopants to give the wafer various desired properties. For example, the wafer may be a P-type wafer (i.e., a wafer which has been doped with an element from Group 3 of the Periodic Table, most typically boron) or an N-type wafer (i.e., a wafer which has been doped with an element from Group 5 of the Periodic Table, most typically arsenic). Preferably, the wafer is a P-type wafer having a resistivity in the range of between about 0.01 and about 50Ω-cm. In a particularly preferred embodiment, the wafer is a P-type wafer having a resistivity in the range of between about 1 and about 20Ω-cm.

Because the wafer is prepared using the Cz method, it typically may have an oxygen concentration anywhere from about $5 \times 10^{17}$ to about $9 \times 10^{17}$ atoms/cm$^3$ (ASTM standard F-121-83). The oxygen precipitation behavior of the wafer becomes essentially decoupled from the oxygen concentration in the ideal precipitating wafer; thus, the starting wafer may have an oxygen concentration falling anywhere within or even outside the range attainable by the Cz method. In addition, depending on the cooling rate of the single crystal silicon ingot from the melting point of silicon (i.e., about 1410° C.) through the range of between about 750° C. and about 350° C., oxygen precipitate nucleation centers may form. The presence or absence of these nucleation centers in the starting material typically is not critical to the present invention provided that these centers are capable of being dissolved by heat-treating the silicon at temperatures not in excess of about 1250° C.

This invention is particularly useful when used with vacancy-rich wafer starting materials. The phrase "vacancy-rich wafers" refers to wafers that contain a relatively large number of crystal lattice vacancy agglomerations. These agglomerations typically have an octahedral structure. In the bulk of the wafer, these agglomerations form voids; whereas at the surface of the wafer, they form COPs. The density of crystal lattice vacancy agglomerations within vacancy-rich wafers is typically from about $5 \times 10^5$ to about $1 \times 10^6$/cm$^3$, and the area density of COPs on the surface of such wafers is typically from about 0.5 to about 10 COPs/cm$^2$. Because such wafers may be sliced from silicon ingots formed by relatively low-cost processes (e.g., the traditional open-architecture Cz processes), these wafers are a particularly preferred starting material.

B. Epitaxial Deposition

The single crystal silicon wafer prepared in accordance with this invention may additionally comprise, if desired, a surface having an epitaxial silicon layer deposited thereon. The epitaxial layer may be deposited onto the entire wafer, or, alternatively, onto only a portion of the wafer. Referring to FIG. 1, the epitaxial layer preferably is deposited onto the front or top surface 3 of the wafer. In a particularly preferred embodiment, it is deposited onto the entire front surface 3 of the wafer. Whether it is preferred to have an epitaxial layer deposited onto any other portion of the wafer will depend on the intended use of the wafer. For most applications, the existence or nonexistence of an epitaxial layer on any other portion of the wafer is not critical.

As noted earlier, single crystal silicon wafers prepared by the Cz method often have COPs on their surfaces. A wafer used for integrated circuit fabrication, however, generally is required to have a surface which is free of COPs. A wafer having such a COP-free surface may be prepared by depositing an epitaxial silicon layer onto the surface of the wafer. Such an epitaxial layer fills in the COPs and ultimately produces a smooth wafer surface. This has been the topic of recent scientific investigations. See Schmolke et al., *The Electrochem. Soc. Proc.*, vol. PV98-1, p. 855 (1998); Hirofumi et al., *J. AppL. Phys.*, vol. 36, p. 2565 (1997). COPs on a an epitaxial silicon layer thickness of at least about 0.1 μm. Preferably, the epitaxial layer has a thickness in the range of between about 0.1 μm and about 2 μm. More preferably, the epitaxial layer has a thickness in the range of between about 0.25 and about 1 μm, and most preferably in the range of between about 0.65 and about 1 μm.

It should be noted that the preferred thickness of the epitaxial layer may vary if the epitaxial layer is used to impart electrical properties to the wafer surface in addition to eliminating COPs. For example, precise control of a dopants concentration profile near the wafer surface may be achieved using an epitaxial layer. Where an epitaxial layer is used for a purpose in addition to eliminating COPs, such a purpose may require an epitaxial layer thickness which is greater than the preferred thickness used to eliminate the COPs. In such an instance, the minimum thickness to achieve the additional desired effect preferably is used. Depositing a thicker layer on the wafer is generally less commercially desirable because forming the thicker layer requires a greater deposition time and more frequent cleaning of the reaction vessel.

If a wafer has a native silicon oxide layer (i.e., a silicon oxide layer which forms on a silicon surface when it is exposed to air at room temperature and generally has a thickness of from about 10 to about 15 Å) on its surface, the silicon oxide layer preferably is removed from the surface of the wafer before the epitaxial layer is deposited onto the surface. As used herein, the phrase "silicon oxide layer" refers to a layer of silicon atoms which are chemically bound to oxygen atoms. Typically, such an oxide layer contains about 2 oxygen atoms per silicon atom.

In a preferred embodiment of this invention, removal of the silicon oxide layer is accomplished by heating the surface of the wafer in an oxidant-free atmosphere until the silicon oxide layer is removed from the surface. More particularly, the surface of the wafer is preferably heated to a temperature of at least about 1100° C., and more preferably to a temperature of at least about 1150° C. This heating preferably is conducted while exposing the surface of the wafer to an atmosphere comprising $H_2$ or a noble gas (e.g., He, Ne, or Ar). More preferably, the atmosphere comprises $H_2$. Most preferably, the atmosphere consists essentially of $H_2$ because use of other atmospheres tends to cause etch pits to form in the surface of the wafer.

Traditionally, epitaxial deposition protocols, which remove a silicon oxide layer by heating a wafer in the presence of $H_2$, include heating the wafer to a high temperature (e.g., from about 900° C. to about 1250° C.) and then baking the wafer at that temperature for a period of time (e.g., typically up to about 90 seconds). It has been discovered, however, that if the surface of the wafer is heated to about 1100° C. (and more preferably, about 1150° C.), the silicon oxide layer is removed without the subsequent bake step, thereby eliminating the need for the bake step. Elimination of the bake step shortens the time required to prepare the wafer, and therefore is commercially desirable.

In a preferred embodiment of this invention, it is preferable to heat the wafer surface to remove the silicon oxide layer and then initiate silicon deposition less than 30 seconds (more preferably within about 10 seconds) after the silicon oxide is removed. Generally, this may be accomplished by heating the wafer surface to a temperature of at least about 1100° C. (more preferably at least about 1150° C.) and then initiating the silicon deposition less than 30 seconds (more preferably within about 10 seconds) after the wafer surface reaches that temperature. Waiting to initiate silicon deposition for up to about 10 seconds after removal of the silicon oxide layer allows the temperature of the wafer to stabilize and become uniform.

During the removal of the silicon oxide layer, the wafer preferably is heated at a rate which does not cause slip. More specifically, if the wafer is heated too quickly, a thermal gradient will develop which will create an internal stress sufficient to cause different planes within the wafer to shift relative to each other (i.e., slip). Lightly doped wafers (e.g., a wafer doped with boron and having a resistivity of about 1 to about 10Ω-cm) have been found to be particularly susceptible to slip. To avoid this problem, the wafer preferably is heated from room temperature to the silicon oxide removal temperature at an average rate in the range of between about 20 and about 35° C./sec. Preferably, this heating is accomplished by exposure to radiant heat such as light from halogen lights.

The epitaxial deposition preferably is carried out by chemical vapor deposition. Generally speaking, chemical vapor deposition involves exposing the surface oft he wafer to an atmosphere comprising silicon in an epitaxial deposition reactor, e.g., an EPI CENTURA® reactor (Applied Materials, Santa Clara, Calif.). In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The gases are introduced into the chamber through inlet means (not shown) communicating between a source of the fluid and the chamber. The interior chamber 90 is defined by a housing, designated generally as 89, comprising a plurality of walls 91, 92, 93, 94, 95 and 96 with the wall 96 forming the bottom of the chamber. The housing also includes a door 97 which is selectively open and closed and when closed the chamber interior is sealed from the exterior so a pressure differential can be maintained with the exterior and/or prevent the ingress and egress of undesirable fluids during processing of the wafers. The atmosphere also preferably contains a carrier gas (preferably $H_2$). In one embodiment, the source of silicon during the epitaxial deposition is $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature.

The rate of growth of the epitaxial deposition preferably is from about 3.5 to about 4.0μm/min when the deposition is conducted under atmospheric pressure. This may be achieved by, for example, by using an atmosphere consisting essentially of about 2.5 mole % $SiHCl_3$ and about 97.5 mole % $H_2$ at a temperature of about 1150° C. and an absolute pressure up to about 1 atm.

If the intended use of the wafer requires that the epitaxial layer include a dopants, the atmosphere comprising silicon also preferably contains the dopants. For example, it is often preferable for the epitaxial layer to contain boron. Such a layer may be prepared by, for example, including $B_2H_6$ in the atmosphere during the deposition. The mole fraction of $B_2H_6$ in the atmosphere needed to obtain the desired properties (e.g., resistivity) will depend on several factors, such as the amount of boron out-diffusion from the particular substrate during the epitaxial deposition, the quantity of P-type dopants that are present in the reactor and substrate as contaminants, and the reactor pressure and temperature. This can be accomplished by using an atmosphere containing about 0.03 ppm of $B_2H_6$ (i.e., about 0.03 mole of $B_2H_6$ per 1,000,000 moles of total gas) at a temperature of about 1125° C. and an absolute pressure of up to about 1 atm. to obtain an epitaxial layer having a resistivity of about 10Ω-cm.

Once an epitaxial layer having the desired thickness has been formed, the atmosphere comprising silicon preferably is purged with a noble gas (e.g., Ar, Ne, or He) or $H_2$, and most preferably is purged with $H_2$. Afterward, the wafer preferably is cooled to a temperature of no greater than 700° C. and then removed from the epitaxial deposition reactor.

Conventional epitaxial deposition protocols typically include a post-epi cleaning step following epitaxial deposition to remove byproducts formed during the epitaxial deposition. This step is used to prevent time-dependent haze, which results if such byproducts react with air. In addition, many post-epi cleaning techniques tend to form a silicon oxide layer on the epitaxial surface which tends to passivate (i.e., protect) the surface. Conventional post-epi cleaning methods entail, for example, immersing the epitaxial surface in any of a number of cleaning solutions which are well-known to those of ordinary skill in the art. These solutions include, for example, piranha mixtures (i.e., mixtures of sulfuric acid and hydrogen peroxide), SC-1 mixtures, and SC-2 mixtures. Many such post-epi cleaning steps require at least 5 minutes to complete. It has been discovered, however, that the post-epi cleaning step is generally not necessary before conducting the next step (i.e., the heat treatment step discussed below). This is due to the fact that the heat treatment step is conducted in an atmosphere comprising an oxidant, preferably oxygen gas. The oxidant tends to react with the epitaxial deposition byprqoucts left on the wafer surface after the deposition. This reaction between the oxidant and the byproducts produces volatile substances which desorb from the wafer surface. In addition to removing the epitaxial deposition byproducts, the oxidant also forms an oxide layer on the epitaxial layer which passivates the epitaxial layer. Thus, there is no need to use a conventional post-epi cleaning treatment (particularly a treatment comprising contacting the wafer with a post-epitaxial cleaning solution) before conducting the next step of this process.

C. Heat Treatment to Influence the Precipitation Behavior of Oxygen in the Wafer in a Subsequent Thermal Processing Step The wafer is treated, after epitaxial deposition if expitaxial deposition is provided, to form a template of crystal lattice vacancies within the wafer which causes an ideal, non-uniform depth distribution of oxygen precipitates to form within the wafer when the wafer is heat-treated, such as during a heat treatment cycle of essentially any electronic device manufacturing process. FIG. 2 shows one such oxygen precipitate distribution which may be formed using this invention. In this particular embodiment, the wafer 1 is characterized by regions 15 and 15' ("denuded zones") which are substantially free of oxygen precipitates. These zones extend from the front surface 3 and back surface 5 to a depth of t and t', respectively. Preferably, t and t' are each in the range of between about 10 and about 100$\mu$m, and more preferably in the range of between about 50 and about 100$\mu$m. Between the oxygen precipitate-free regions 15 and 15', there is a region 17 which contains a substantially uniform concentration of oxygen precipitates. For most applications, the oxygen precipitate concentration in region 17 is at least about $5 \times 10^8$ precipitates/cm$^3$, and more preferably is $1 \times 10^9$ precipitates/cm$^3$. It should be recognized that the purpose of FIG. 2 is to help acquaint those skilled in the art with this invention by illustrating merely one embodiment of this invention. This invention is not limited to that embodiment. For example, this invention may also be used to form a wafer having only one denuded zone 15 (instead of two denuded zones 15 and 15').

To form the template of crystal lattice vacancies, the wafer generally is first heated and then cooled at a rate of at least about 10° C./sec. The purpose of heating the wafer is to: (a) form self-interstitial and vacancy pairs (i.e., Frenkel defects) in the crystal lattice which are distributed uniformly throughout the wafer, and (b) dissolve any unstabilized oxygen precipitate nucleation centers present in the wafer. Generally, heating to greater temperatures results in a greater number of Frenkel defects being formed. The purpose of the cooling step is to produce a non-uniform distribution of crystal lattice vacancies, wherein the vacancy concentration is maximum at or near the center of the wafer, and decreases in the direction of the surfaces of the wafer. This non-uniform distribution of crystal lattice vacancies is caused by the fact that a portion of vacancies near the surfaces of the wafer diffuse to the surfaces during the cool down and thereby become annihilated, resulting in lower concentrations of vacancies near the surfaces.

The non-uniform vacancy profile, in turn, is a template for oxygen precipitation when the wafer is subsequently heated as for example when making electronic components with the wafer. Specifically, when the wafer 1 (see FIG. 2) is heated, oxygen will cluster rapidly to form precipitates 52 in the region 17 of the wafer 1 containing higher concentrations of vacancies, but will tend not to cluster in the regions 15 and 15' near the wafer surfaces 3 and 5 which contain lower concentrations of vacancies. Typically, the oxygen nucleates at temperatures in the range of between about 500° C. and about 800° C., and grows precipitates at temperatures in the range of between about 700° C. and about 1000° C. Thus, for example, the non-uniform distribution of oxygen precipitates 52 in a wafer may be formed during a heat treatment cycle of an electronic device manufacturing process, given that such heat treatment cycles often are conducted at temperatures near 800° C.

As previously described, this invention may advantageously be used to treat a vacancy-rich wafer starting material, which has a relatively large number of COPs on its surface and voids within its bulk. FIG. 3 shows the crystal lattice vacancy agglomerate 51 and oxygen precipitate 52 profile for an epitaxial wafer prepared from a vacancy-rich wafer starting material in accordance with this invention and then heat-treated to form oxygen precipitates. An epitaxial layer 50 is on the outer surfaces 3, 4, and 6 (no epitaxial layer is on the back surface 5 in this particular embodiment) of the wafer 1. Because the epitaxial layer has filled in the COPs, the wafer has smooth, COP-free surfaces 2 and 8. The profile of the oxygen precipitates 52 is similar to the oxygen precipitate profile in FIG. 2, and is sufficient for intrinsic getting. The profile of the vacancy agglomerates 51 completely within the bulk (i.e., the profile of the voids within the bulk) of the wafer 1 essentially remains the same throughout the process of this invention (i.e., the concentration remains about $5 \times 10^4$ to about $1 \times 10^6$/cm$^3$) and does not tend to affect the surfaces 2 and 8 of the wafer 1 due to the existence of the epitaxial layer 50 which acts as a barrier between the surfaces 2 and 8 and the agglomerates 51. Thus, the wafer making process is commercially useful, in part, because it enables the formation of a silicon wafer having intrinsic getting ability and a COP-free surface from vacancy-rich starting material and one or more denuded zones, which wafer can be prepared with relatively low cost and with less capital equipment.

The heating and rapid cool-down to form the denuded zone(s) is carried out in the EPI forming chamber in which the wafers are heated by a suitable heat source that is operably associated with the chamber. The formation of the denuded zone(s) is accomplished after the formation of the epitaxial layer, if one is formed, to maintain the denuded zone effect. A suitable heat source is banks of high power lamps such as those used in a rapid thermal annealing ("RTA") furnace. The lights are capable of rapidly heating a silicon wafer. For example, many are capable of heating a wafer from room temperature to 1200° C. in a few seconds. Examples of commercially available RTA furnaces include the model 610 furnace available from AG Associates (Mountain View, Calif.) and the CENTURA® RTP from Applied Materials (Santa Clara, Calif.).

Figure 7:
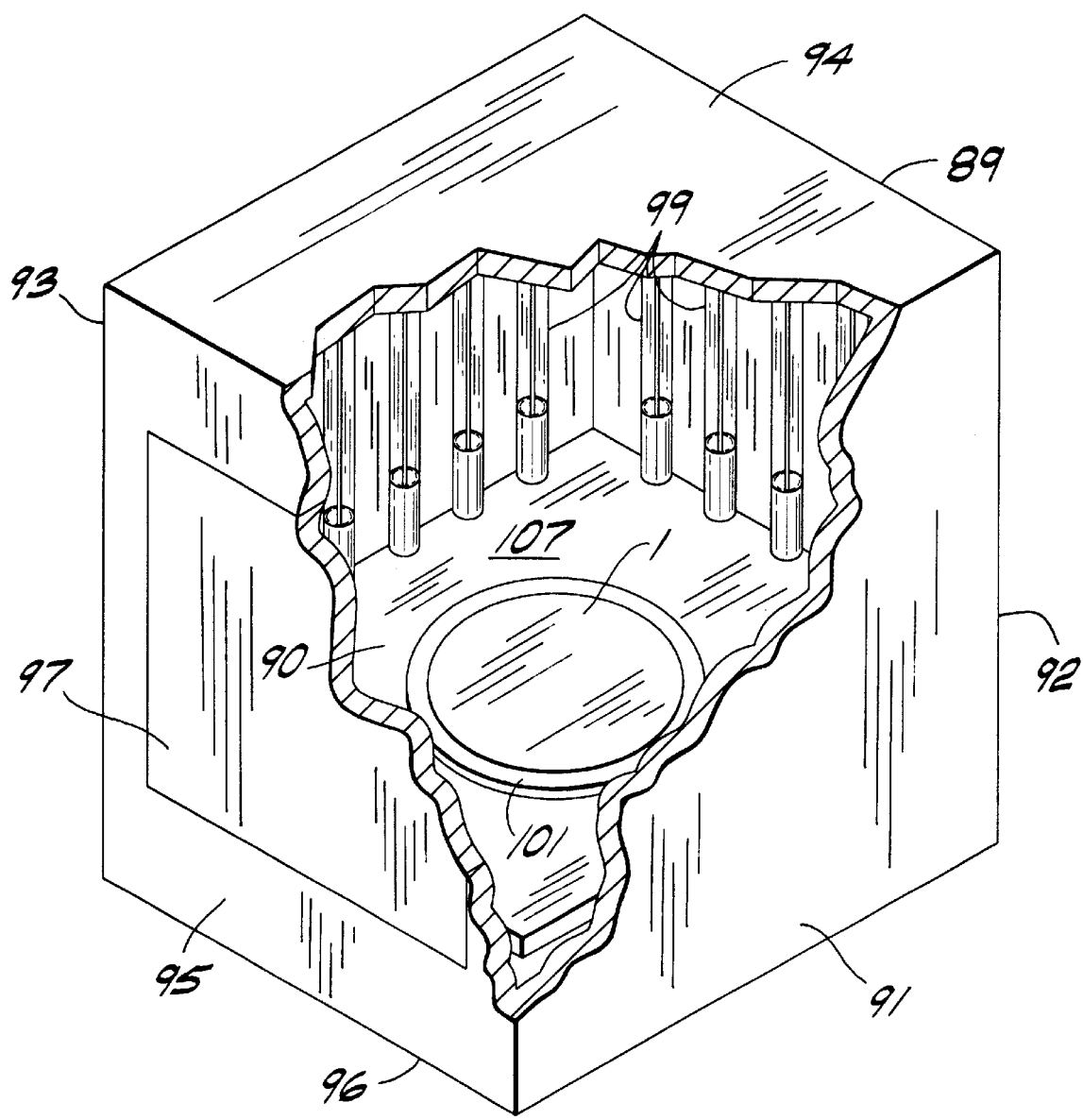
FIG. 7 is a schematic diagram of the reactor with portions broken away to show internal details.

The heating and rapid cool-down to form the denuded zone(s) are carried out in the epitaxial deposition reactor. This allows for the elimination of the need for a second heating chamber and eliminates the handling of wafers to effect a transfer from an EPI chamber to an RTA. A heat source is operably associated with the interior chamber 90 and as shown, includes a bank of high power lamps 99, such as halogen lamps mounted in the interior 90. The lamps 99 are activated to heat the wafer 1 with energy from the light while it is supported by the support 101 in the process position (FIG. 7). Preferably, the support 101 and wafer are rotated by suitable drive means 100 while being heated so that the wafer is heated more uniformly across its width. These lamps may be the same ones that were used for the earlier heating steps. Referring to FIG. 4–7, the housing 89 includes the support 101 for supporting the wafer during heating and cooling to form the denuded zone. In order to effect the rapid cooling, the wafer needs to be spaced from support means or other elements having high heat capacity at least during cooling. To improve the temperature uniformity across the width of the wafer 1, a heated body or susceptor 102 can be positioned adjacent to and in immediate radiant heat transfer relation with the wafer 1 during heating or processing. If a susceptor 102 is used, the spacing between the wafer 1 and the susceptor should be in the range of between about 2mm and about 30 mm. If a susceptor is used, it would preferably move away from the wafer 1 during cooling to increase the cooling rate. The support 101 in the preferred embodiment is an annular ring preferably made of a heat resistant material such as quartz and/or SiC which are also resistant to contaminating the wafer 1. The support 101 has an opening 103 that is slightly smaller than the wafer 1, both being preferably round, where the wafer overlies a portion of the upper surface 104 of the support. The diameter of the center opening 103 is smaller than the diameter of the wafer and the support 101 contacts only a small portion of the periphery or edge margin 105 of the wafer 1, preferably less than about 5 mm in from the edge of the wafer. The margin 105 is an exclusion zone and will be trimmed off as scrap and its properties are therefore not important. The support 101 is received in an aperture 106 in a shelf 107.

As shown, the support 101 is suitably supported in the chamber 90 by support means which in the illustrated structure include a plurality of pins or columns 109 that position the support 101 in spaced relation from the walls 91–96 and the door 97. The pins 109 are mounted in an upstanding orientation on a platform 111 comprising a plurality (preferably three in number) of arms 112. The arms 112 are in turn mounted on a shaft 115 that is connected to drive means 100 for rotating the shaft and support 101 and hence the wafer 1. The susceptor 102 can be mounted on the shaft 115, the support 101 or the platform 111 so long as the spacing from the wafer is maintained at least during cooling. Close spacing of a wafer 1 to a susceptor 102 during the epitaxial coating portion of the process could reduce the amount of coating on the back side of the wafer 1.

Lift pins 120 are mounted on the support 101 and are axially movable within bores 122 in the support. The lift pins 120 are operable to raise and lower the wafer 1 for loading and unloading of the wafer with a blade 121. The pins 120 have enlarged heads 124 that prevent them from falling out of the bores 122. The pins 120 also have lower ends 126 each engageable with a respective foot 128. As shown, the feet 128 are mounted on arms 130 (both preferably being three in number) which in turn are mounted on a shaft 132. The shaft 132 is axially movably mounted on the shaft 115 for relative axial movement. Drive means such as pneumatic cylinders 135 are operably connected to the shafts 115, 132 to effect selective axial movement thereof. Further, the shaft 132 will rotate with the shaft 115 to prevent interference between the arms 112 and the pins 120.

Cooling of the wafer 1 needs to be rapid, at a rate of at least about 10° C./sec, preferably at least about 15° C./sec, more preferably at least about 20° C./sec and still more preferably at least about 50° C./sec. The present invention achieves this by use of the support 101. Quick cooling is achieved by having a significant portion of the opposite faces 3, 5 or 4, 6 of the wafer 1 in contact with the gaseous environment of the chamber 90 and not a solid or high heat capacity support member.

For most applications, the wafer 1 preferably is heated in the oxidizing atmosphere to form the denuded zone(s) to a soak temperature of at least about 1175° C. More preferably, it is heated to a soak temperature in the range of between about 1200° C. and about 1250° C. The temperatures of the wafer as disclosed herein are measured as a surface temperature with a temperature measuring device such as a pyrometer. Once the temperature of the wafer reaches the preferred soak temperature, the wafer temperature preferably is held at the soak temperature for a period of time. The preferred amount of soak time generally is in the range of between about 5 and about 30 seconds. The wafer preferably is held at the soak temperature for a time in the range of between about 5 and about 10 seconds. For slower cooling rates, the wafer may be heated to a higher temperature to generate a higher concentration of silicon lattice vacancies before the cool-down step.

Figure 9:
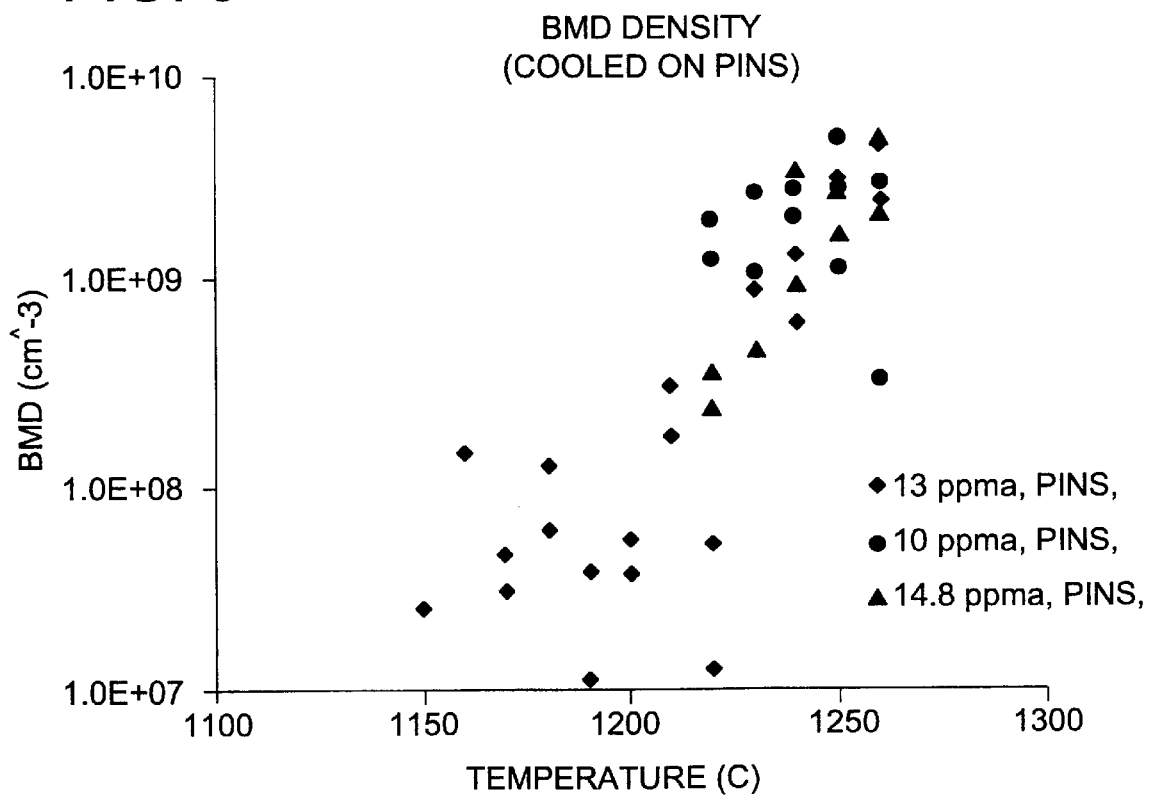
FIG. 9 is a graph showing BMD levels as a function of the soak temperature.
Figure 8:
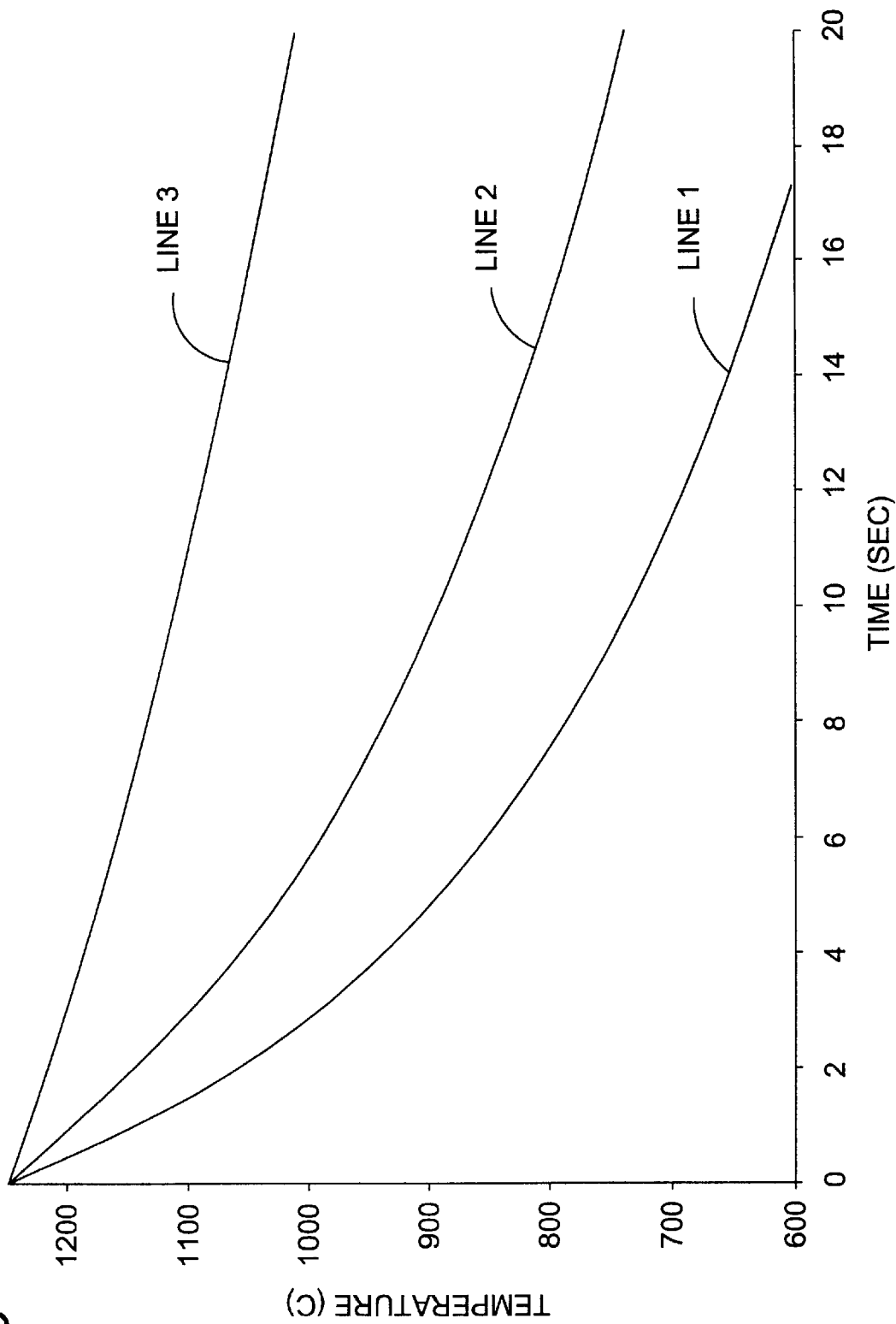
FIG. 8 is a graph of a computer simulation showing the cooling rate of a wafer on various wafer support arrangements.

FIGS. 8 and 9 illustrate the results of the present invention. FIG. 8 is a computer simulation illustrating the difference in cooling rates for various wafer/support arrangements. Line 1 represents a calculated temperature/time relationship for a cooling wafer when the wafer cools on a susceptor. Line 2 represents a calculated temperature/time relationship for a cooling wafer when the wafer cools on pins but elevated or slightly separated from a susceptor. Line 3 represents a calculated temperature/time relationship for a cooling wafer when the wafer cools on the support 101 with no susceptor present. FIG. 8 shows the significantly increased cooling rate for cooling on an annular support as compared to cooling on a susceptor. FIG. 9 illustrates relationships between BMD (Bulk Micro Defects) produced and soak temperature for three different starting materials A, B, C which were fast cooled on pins. Material A contained 13 ppma (part per million atomic of interstitial oxygen), Material B contained 10 ppma and Material C contained 14.8 ppma. The graph illustrated the effectiveness in the production of BMD using different starting materials and different soak temperatures. The production of BMD is desirable to enhance the quality of the wafer 1.

Following the heat treatment of the wafer 1, the wafer is rapidly cooled as described above. This cooling step may conveniently be carried out in the housing 89 in which the heat-treatment is conducted. Alternatively, it preferably is carried out in an atmosphere which will not react with the wafer surface. The rapid cooling rate preferably is used as the temperature of the wafer decreases through the range of temperatures at which crystal lattice vacancies diffuse through the single crystal silicon. Once the wafer is cooled to a temperature outside the range of temperatures at which crystal lattice vacancies are relatively mobile, the cooling rate does not significantly influence the precipitating characteristics of the wafer, and, thus, is not narrowly critical. Generally, crystal lattice vacancies are relatively mobile at temperatures greater than about 850° C. It is preferred to fast cool the wafer to a temperature of less than about 850° C. and preferably less than about 800° C.

In a preferred embodiment, the average cooling rate of the wafer is at least about 10° C./sec. as its temperature falls from the soak temperature to a temperature which is at least about 325° C. less than the denuded zone formation soak temperature. More preferably, the average cooling rate of the wafer is at least about 15° C./sec. as its temperature falls from the soak temperature to a temperature which is at least about 325° C. less than the soak temperature. Still more preferably, the average cooling rate of the wafer is at least about 20° C./sec. as its temperature falls from the soak temperature to a temperature which is at least about 325° C. less than the soak temperature. Most preferably, the average cooling rate of the wafer is at least about 50° C./sec. as its temperature falls from the soak temperature to a temperature which is at least about 325° C. less than the soak temperature.

In a particularly preferred embodiment, the average cooling rate of the wafer is at least about 10° C./sec. as its temperature falls from the denuded zone formation soak temperature to a temperature which is at least about 400° C. less than the soak temperature. More preferably, the average cooling rate of the wafer is at least about 15° C./sec. as its temperature falls from the soak temperature to a temperature which is at least about 400° C. less than the soak temperature. Still more preferably, the average cooling rate of the wafer is at least about 20° C./sec. as its temperature falls from the soak temperature to a temperature which is at least about 400° C. less than the soak temperature. Most preferably, the average cooling rate of the wafer is at least about 50° C./sec. as its temperature falls from the soak temperature to a temperature which is at least about 400° C. less than the soak temperature.

In another particularly preferred embodiment, the average cooling rate of the wafer is at least about 10° C./sec. as its temperature falls from the denuded zone formation soak temperature to a temperature which is at least about 450° C. less than the soak temperature. More preferably, the average cooling rate of the wafer is at least about 15° C./sec. as its temperature falls from the soak temperature to a temperature which is at least about 450° C. less than the soak temperature. Still more preferably, the average cooling rate of the wafer is at least about 20° C./sec. as its temperature falls from the soak temperature to a temperature which is at least about 450° C. less than the soak temperature. Most preferably, the average cooling rate of the wafer is at least about 50° C./sec. as its temperature falls from the soak temperature to a temperature which is at least about 450° C. less than the soak temperature.

It has been found that the typical average cooling rate (i.e., about 10 to 15° C./sec.) of a wafer in typical epitaxial reactor was far less than the typical average cooling rate (i.e., about 70 to 100° C./sec) that could be achieved in an RTA at temperatures where crystal lattice vacancies are relatively mobile. The present invention provides an alternative to the use of an RTA to form the denuded zone(s).

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method of processing semiconductor wafers to produce a denuded zone by heating and cooling the wafer in a chamber having a heat source and an annular wafer support, said method comprising:

placing a semiconductor wafer in a chamber having an interior, a heat source operatively associated with the interior and an annular wafer support positioned in the interior;

heating the wafer in the chamber interior to a temperature of at least about 1175° C. and thereafter cooling said wafer at a rate of at least about 10° C./sec. until the wafer has a temperature of less than about 850° C. whereby during which cooling, said wafer is resting on the annular support whereby only a peripheral portion of the wafer is in contact with said support, for producing denuded zone.

2. A method as set forth in claim 1 including heating a wafer in the chamber interior to a temperature in the range of between about 900° C. and about 1150° C. and depositing an epitaxial layer thereon to form a coated wafer.

3. A method as set forth in claim 1 wherein said cooling rate is at least about 15° C./sec.

4. A method as set forth in claim 3 wherein said cooling rate is at least about 20° C./sec.

5. A method as set forth in claim 4 wherein said cooling rate is at least about 50° C./sec.

6. A method as set forth in claim 3 wherein said cooling rate is at least about 15° C./sec until the temperature of the wafer is reduced at least about 325° C.

7. A method as set forth in claim 4 wherein said cooling rate is at least about 20° C./sec until the temperature of the wafer is reduced at least about 325° C.

8. A method as set forth in claim 5 wherein said cooling rate is at least about 50° C./sec until the temperature of the wafer is reduced at least about 325° C.

9. A method as set forth in claim 3 wherein said cooling rate is at least about 15° C./sec until the temperature of the wafer is reduced at least about 400° C.

10. A method as set forth in claim 4 wherein said cooling rate is at least about 20° C./sec until the temperature of the wafer is reduced at least about 400° C.

11. A method as set forth in claim 5 wherein said cooling rate is at least about 50° C./sec until the temperature of the wafer is reduced at least about 400° C.

12. A method as set forth in claim 3 wherein said cooling rate is at least about 15° C./sec until the temperature of the wafer is reduced at least about 450° C.

13. A method as set forth in claim 4 wherein said cooling rate is at least about 20° C./sec until the temperature of the wafer is reduced at least about 450° C.

14. A method as set forth in claim 5 wherein said cooling rate is at least about 50° C./sec until the temperature of the wafer is reduced at least about 450° C.

15. A method as set forth in claim 1 wherein said heat source is light.

16. A method as set forth in claim 15 wherein said heat source is a halogen lamp.

17. A method as set forth in claim 1 wherein said wafer is maintained substantially free of conductive heat transfer relation with the wafer support during said heating and cooling to form the denuded zone.

* * * * *